United States Patent
Iwata

[19]

[11] Patent Number: 5,939,957
[45] Date of Patent: Aug. 17, 1999

[54] 6-ELEMENTS LADDER TYPE PIEZOELECTRIC FILTER

[75] Inventor: Tatsuo Iwata, Nagoya, Japan

[73] Assignee: NGK Spark Plug Co., Ltd., Japan

[21] Appl. No.: 08/899,891

[22] Filed: Jul. 24, 1997

[30] Foreign Application Priority Data

Jul. 26, 1996 [JP] Japan ................................ 8-215182

[51] Int. Cl.$^6$ ................................................ H03H 9/58
[52] U.S. Cl. ........................... 333/189; 333/187; 310/368
[58] Field of Search ................................ 333/186–192; 310/321, 367, 368, 311

[56] References Cited

U.S. PATENT DOCUMENTS

| | | | |
|---|---|---|---|
| 4,353,045 | 10/1982 | Matsui et al. | 333/190 |
| 4,398,162 | 8/1983 | Nagai | 333/189 |
| 4,651,109 | 3/1987 | Inoue | 333/189 |
| 4,841,264 | 6/1989 | Oshikawa | 333/189 |
| 4,864,259 | 9/1989 | Takamoro et al. | 333/189 |
| 5,057,802 | 10/1991 | Ozeki et al. | 333/189 |
| 5,077,544 | 12/1991 | Ogawa et al. | 333/189 |
| 5,130,680 | 7/1992 | Nagai et al. | 333/189 |
| 5,332,982 | 7/1994 | Kawakami | 333/189 |

*Primary Examiner*—Robert Pascal
*Assistant Examiner*—Barbara Summons
*Attorney, Agent, or Firm*—Larson & Taylor

[57] ABSTRACT

A ladder type piezoelectric filter has a circuit configuration such that a group delay time characteristic of the filter can easily be improved. The piezoelectric filter includes six resonators, a pair of series resonators S1 and S2 connected in series between input and output terminals. A pair of parallel resonators P1 and P2 and another pair of parallel resonators P3 and P4 are respectively connected between the connection point of the series resonators S1 and S2 and a grounding terminal and between the connection point of the downstream series resonator S2 and the output terminal and the grounding terminal.

5 Claims, 4 Drawing Sheets

6-ELEMENTS LADDER TYPE PIEZOELECTRIC FILTER

BACKGROUND OF THE INVENTION

1. Field of the Invention

The present invention relates to a ladder type piezoelectric filter to be suitably used in a filter circuit of portable and mobile radio communication equipment such as an automobile telephone set and, more particularly, the present invention relates to a ladder type piezoelectric filter to be most suitably used for digital telecommunications purposes.

2. Prior Art

Known ladder type piezoelectric filters of the type under consideration comprise a plurality of series resonators and parallel resonators arranged alternately between terminals including input terminals, output terminals and grounding terminals. In any of these filters, the resonant frequency of the series resonators and the antiresonant frequency of the parallel resonators are made to agree with each other and the difference between the resonant frequency and the antiresonant frequency is held to a constant value for both the series and parallel resonators.

FIG. 1 of the accompanying drawings is a circuit diagram of a ladder type piezoelectric filter circuit comprising six resonators, or three series resonators S having a resonant frequency of about 455 kHz and an antiresonant frequency of about 477 kHz and three parallel resonators P having a resonant frequency of about 433 kHz and an antiresonant frequency of about 455 kHz, the difference Δf between the resonant frequency and the antiresonant frequency being held to 22 kHz for both the series resonators and the parallel resonators. In FIG. 1 L1 denotes an input and output circuit and L2 a grounding circuit.

FIGS. 2 and 3 are graphs showing respectively the filtering performance and the group delay time characteristic of a ladder type piezoelectric filter having such a configuration. While the filter operates satisfactorily in terms of safeguard attenuation as shown in FIG. 2, its group delay performance lacks flatness as clearly seen from FIG. 3. To improve the group delay time characteristic has been required.

On the other hand, piezoelectric filters are required to show a short group delay time in order to minimize the phase distortion. However, 6-elements type piezoelectric filters as described above have the drawback of a long group delay time, although they show an improved attenuation performance.

While it is known that the performance of a piezoelectric filter of the type under consideration is improved in terms of group delay time by using piezoelectric resonators made of a low Qm piezoelectric material, this technique of improving the group delay time to make it show a desired value is practically not feasible because it requires the development of a new material and a subsequent series of cumbersome operations of quantifying the performance of the developed material.

Additionally, attempts have been made to improve the performance of a known piezoelectric filter of the type under consideration by inserting an elastic sheet between any adjacently disposed resonators and/or by specifically treating the terminal plates. However, such techniques of adding physical means are accompanied by the problem of an increased number of components and an increased number of processing steps.

It is therefore, an object of the present invention to provide a ladder type piezoelectric filter comprising six resonators and having a circuit configuration such that the group delay time characteristic of the filter can easily be improved.

SUMMARY OF THE INVENTION

According to the invention, the above object is achieved by providing a 6-elements ladder type piezoelectric filter comprising first and second series resonator inserted and electrically connected between the input and output terminals, first and second parallel resonators inserted and electrically connected between a contact point of the first and second series resonators and a grounding terminal, and third and fourth parallel resonators inserted and electrically connected between the contact point of said second series resonator and the output terminal and the grounding terminal.

Each of the series resonators may have a thickness larger than that of each of said parallel resonators.

Preferably, each of the series and parallel resonators may comprise a thin and rectangularly parallelepipedic piezoelectric ceramic plate and a pair of electrodes arranged respectively on top and bottom surfaces thereof.

Also, each of the series resonators may have a mechanical quality coefficient substantially equal to that of each of the parallel resonators.

Furthermore, the series resonators may have substantially equal external sizes and said parallel resonators may have substantially equal external sizes.

The inventor of the present invention found that the piezoelectric filter according to the invention having a configuration as described above shows reduced group delay times and an improved flatness when compared with a conventional ladder type piezoelectric filter. Thus, the ladder type piezoelectric filter according to the invention is superior to the conventional counterpart in terms of both attenuation and group delay time characteristices.

Now, the present invention will be described by referring to the accompanying drawings that illustrate a preferred embodiment of the invention.

DETAILED DESCRIPTION OF THE PREFERRED EMBODIMENT

Figure 4:
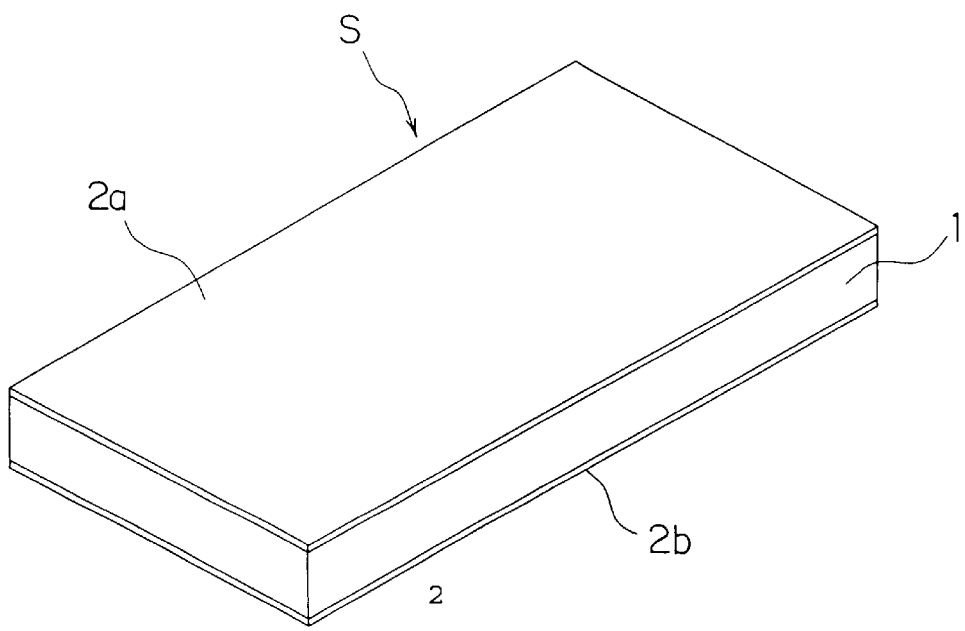
FIG. 4 is a schematic perspective view showing a series resonator S which is used for a ladder type piezoelectric filter according to the invention.

FIG. 4 illustrates a piezoelectric resonator S of a small capacitance to be used on a series branch of a ladder type filter circuit as it is inserted between input and output terminals as first or second series resonators. It comprises a thin and rectangularly parallelepipedic piezoelectric ceramic plate 1 typically made of lead titanate zirconate and having a predetermined thickness and a pair of electrodes 2a and 2b arranged respectively on a top and bottom surfaces of the piezoelectric ceramic plate 1.

Figure 5:
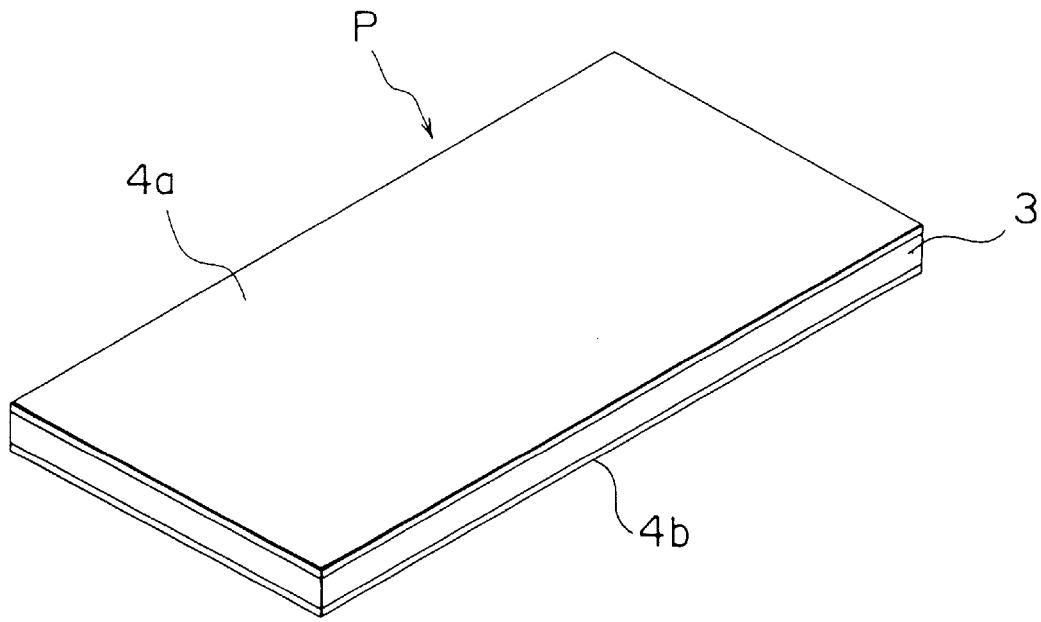
FIG. 5 is a schematic perspective view showing a parallel resonator P which is used for the ladder type piezoelectric filter according to the invention.

FIG. 5 illustrates a piezoelectric resonator P of a large capacitance to be used on a parallel branch of the ladder type filter circuit as it is inserted between the contact or connection point of the first and second series resonators and a grounding terminal as a first or second parallel resonator or between the second series resonator and the output terminal as a third or fourth parallel resonator. Like the series resonator S shown in FIG. 4, it comprises a thin and rectangularly parallelepipedic piezoelectric ceramic plate 3 having a predetermined thickness smaller than that of the series resonator S and a pair of electrodes 4a and 4b arranged respectively on top and bottom surfaces of the piezoelectric ceramic plate 3.

As the parallel resonator P has a reduced thickness as compared with the series resonator S, the former shows a large capacitance ratio and an increased attenuation relative to the latter.

Tables 1 and 2 below show the dimensions and some of the properties of the thus constructed series resonator S and parallel resonator P.

TABLE 1

| Element | Dimensions (mm) | Resonant frequency (kHz) | Antiresonat frequency (kHz) |
| --- | --- | --- | --- |
| Series resonator | 3.7(length) × 0.8(width) × 0.6(thickness) | 455.5 | 477.5 |
| Parallel resonator | 3.97(length) × 1.0(width) × 0.2(thickness) | 432.0 | 454.0 |

TABLE 2

| Element | Electrostatic capacitance (pF) | Mechanical quality coefficient (Qm) |
| --- | --- | --- |
| Series resonator | 105.0 | 140.0 |
| Parallel resonator | 350.0 | 140.0 |

Figure 6:
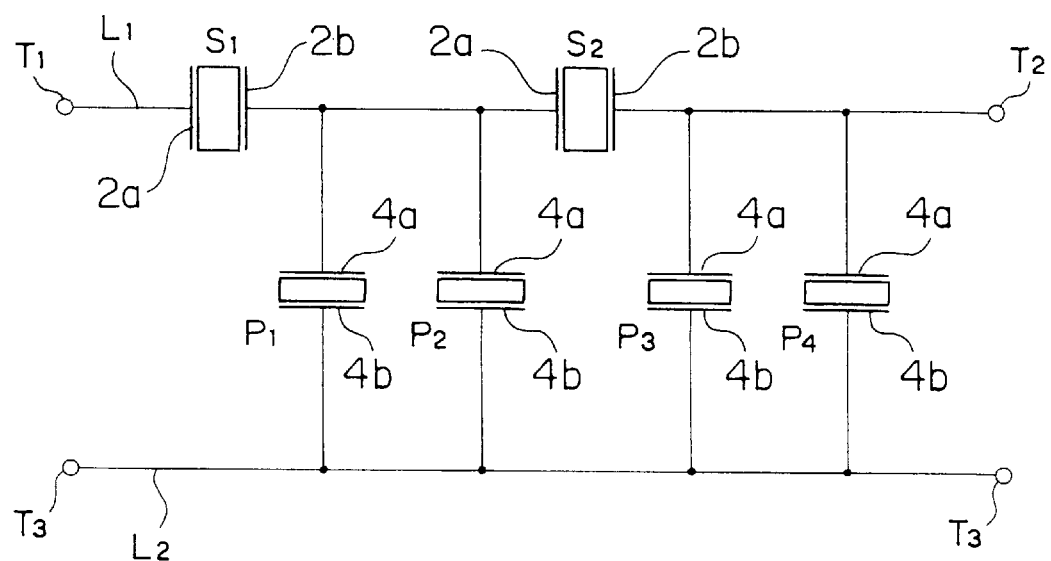
FIG. 6 is a circuit diagram of an embodiment of the ladder type piezoelectric filter according to the invention.

FIG. 6 illustrates a circuit diagram of an embodiment of ladder type piezoelectric filter according to the invention. The illustrated filter circuit comprises first and second series resonators S1 and S2 of the type shown in FIG. 4 connected in series to input/output line L1 that connects an input terminal T1 and an output terminal T2 of the filter and first through fourth parallel resonators P1, P2, P3 and P4 of the type shown in FIG. 5 connected in parallel between the input/output line L1 and grounding line L2 that connects grounding terminals T3 of the filter. More specifically, the first electrode 2a of the first series resonator S1 is connected to the input terminal T1 and the second electrode 2b of the second series resonator S2 is connected to the output terminal T2, while the second electrode 2b of the first series resonator S1 and the first electrode 2a of the second series resonator S2 are connected to each other.

Furthermore, the first and second parallel resonators P1 and P2 are inserted between the connection point of the first and second series resonators S1 and S2 and the grounding line L2 in such a way that the first electrodes 4a of the first and second parallel resonators P1 and P2 are electrically connected to each other and the second electrodes 4b of the first and second parallel resonators P1 and P2 are electrically connected to the grounding line L2 for parallel connection.

Likewise, the third and fourth parallel resonators P3 and P4 are inserted between the connection point of the second series resonator S2 and the output terminal T2 and the grounding line L2 in such a way that the first electrodes 4a of the third and fourth parallel resonators P3 and P4 are electrically connected to each other and the second electrodes 4b of the third and fourth parallel resonators P3 and P4 are electrically connected to the grounding line L2 for parallel connection.

Figure 7:
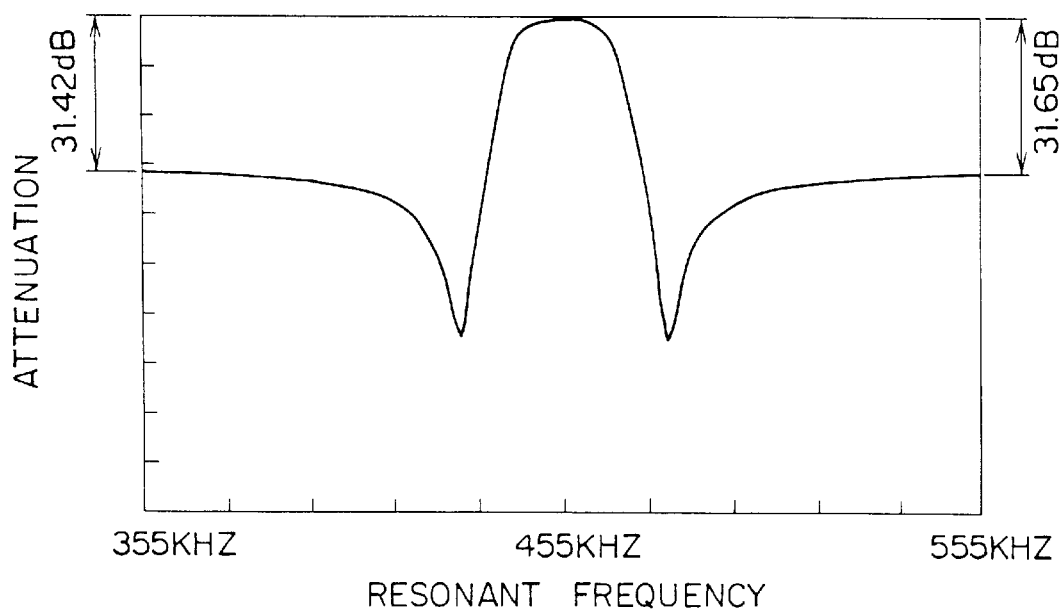
FIG. 7 is a graph showing the filtering characteristic of the illustrated filter according to the invention.
Figure 8:
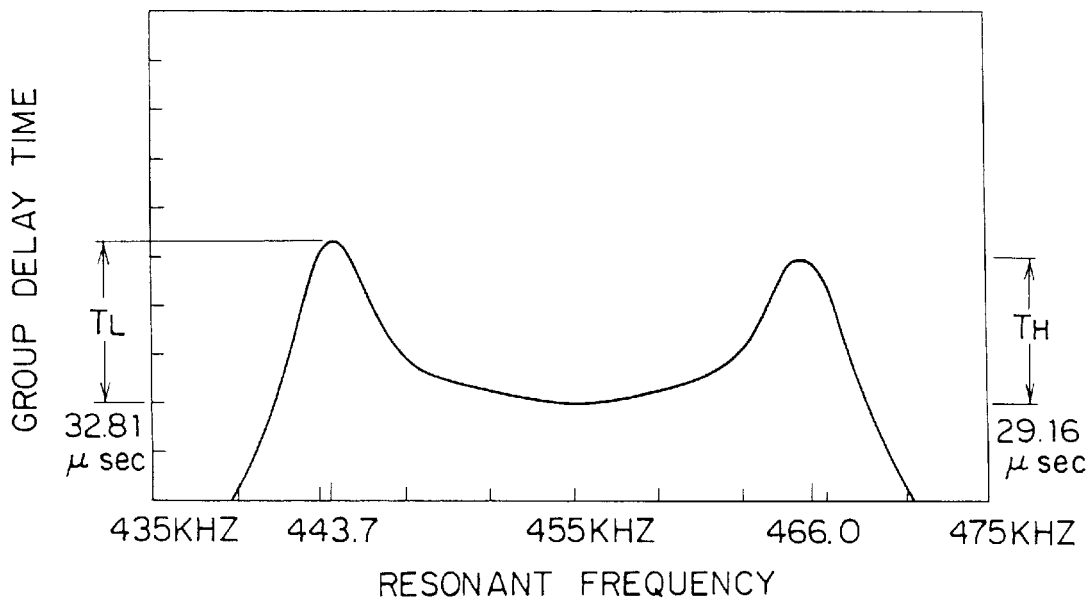
FIG. 8 is a graph showing the group delay time characteristic of the illustrated filter according to the invention.

FIG. 7 is a graph showing the filtering characteristic of the filter circuit thus arranged and FIG. 8 is a graph showing its group delay time characteristic obtained in an experiment. The attenuation of the illustrated filter circuit was 31.42 dB (at 355 kHz) on the low frequency band side and 31.65 dB (at 555 kHz) on the high frequency band side. It showed a group delay time of TL=32.81 μsec (at 443.7 kHz) on the low frequency band side of the circuit and another group delay time of TH=29.16 μsec (at 466.0 kHz) on the high frequency band side of the circuit.

Figure 1:
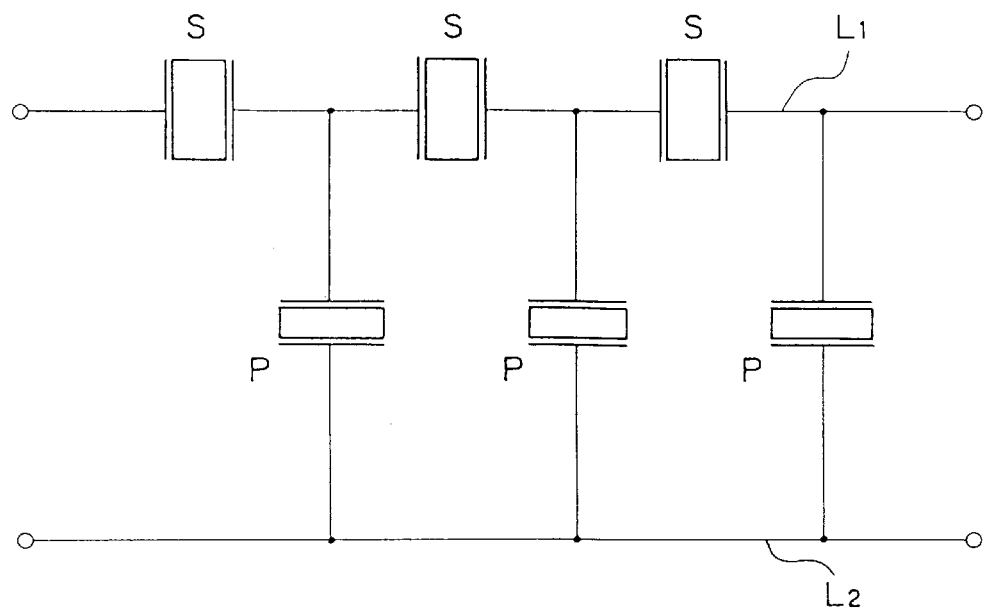
FIG. 1 is a circuit diagram showing a conventional 6-elements ladder type piezoelectric filter.
Figure 2:
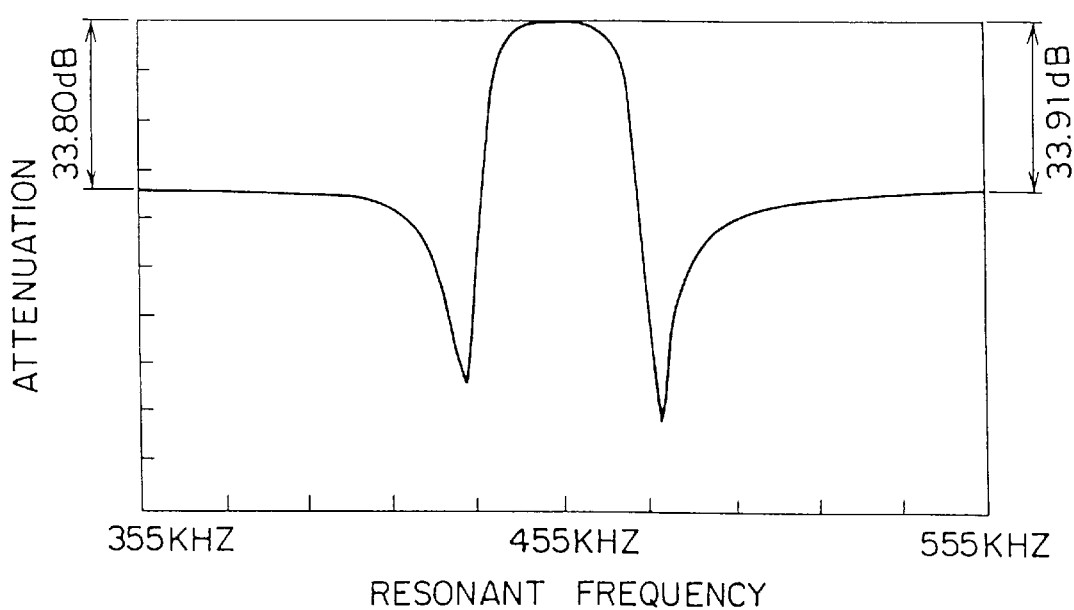
FIG. 2 is a graph showing a filtering characteristic of the conventional piezoelectric filter of FIG. 1.
Figure 3:
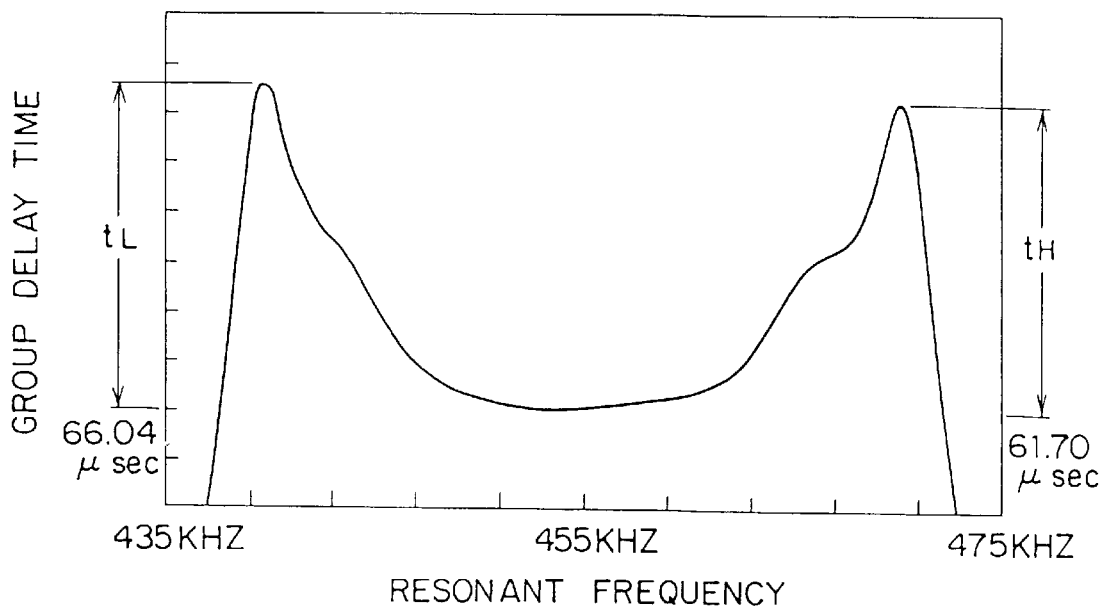
FIG. 3 is a graph showing the group delay time characteristic of the conventional piezoelectric filter of FIG. 1.

On the other hand, the conventional filter circuit comprising parallel resonators P and series resonators S configured exactly the same as those described above and arranged for three L-shaped connections as shown in FIG. 1 was also tested for attenuation and group delay time. As a result, as shown in FIG. 2 the attenuation of the circuit was 33.80 dB (at 355 kHz) on the low frequency band side and 33.91 dB (at 555 kHz) on the high frequency band side. Also as shown in FIG. 3 there are obtained the group delay time of tL=66.04 μsec (at 439.7 kHz) on the low frequency band side of the circuit and another group delay time of tH=61.70 μsec (at 470.0 kHz) on the high frequency band side of the circuit.

As will be clearly seen from the graphs, while the conventional filter circuit operated only slightly better than the embodiment in terms of attenuation, it showed a group delay twice as large as that of its counterpart to prove that the embodiment was by far more preferable than the conventional filter circuit. In other words, the embodiment of the invention of FIG. 6 showed a remarkably improved group delay time as compared with the conventional filter circuit of FIG. 1 without significantly deteriorating the attenuation performance.

While thin and rectangularly parallelepipedic piezoelectric resonators were used in the above embodiment, the present invention is also applicable to square and disc-shaped piezoelectric resonators.

As described above, a ladder type piezoelectric filter comprising six resonators according to the invention is realized by arranging a pair of series resonators S1 and S2 connected in series between the input and output terminals and a pair of parallel resonators P1 and P2 and another pair of parallel resonators P3 and P4 respectively connected between the connection points of the series resonators S1 and S2 and the grounding terminal and between the connection point of the downstream series resonator S2 and the output terminal and the grounding terminal. Thus, the group delay time of the filter can be significantly reduced as compared with any conventional filters without deteriorating the attenuation performance simply by changing the inter-resonators arrangement and hence without the need of developing a new resonator material and arranging a resonator between the elastic sheet and the resonators or by treating the terminal plates.

I claim:

1. A ladder type piezoelectric filter comprising:
   an input terminal;
   an output terminal;
   a grounding terminal;
   two series resonators directly connected in series to each other and inserted between the input and output terminals; and
   four parallel resonators,
      first two of the parallel resonators being connected between (a) a direct contact or connection point of the two series resonators and (b) the grounding terminal, and
      a second two of the parallel resonators being connected between (a) a direct connection or contact point of one of the series resonators and the output terminal and (b) the grounding terminal.

2. A ladder type piezoelectric filter as claimed in claim 1, wherein each of said series resonators has a thickness larger than that of each of said parallel resonators.

3. A ladder type piezoelectric filter as claimed in claim 1, wherein each of said series and parallel resonators comprises a thin and rectangularly parallelepipedic piezoelectric ceramic plate and a pair of electrodes arranged respectively on top and bottom surfaces thereof.

4. A ladder type piezoelectric filter as claimed in claim 1, wherein each of said series resonators has a mechanical quality coefficient substantially equal to that of each of said parallel resonators.

5. A ladder type piezoelectric filter as claimed in claim 1, wherein said series resonators have substantially equal external sizes and said parallel resonators have substantially equal external sizes.

* * * * *